US012676244B2

(12) United States Patent
Bamber et al.

(10) Patent No.: US 12,676,244 B2
(45) Date of Patent: Jul. 7, 2026

(54) REPAIRING A SURFACE OF A DIVERTOR OR FIRST WALL IN A TOKAMAK VIA DEPOSIT OF REFRACTORY METAL WHILE MAINTAINING A VACUUM

(71) Applicant: Tokamak Energy Ltd, Abingdon (GB)

(72) Inventors: Robert Bamber, Abingdon (GB); Mike Jackson, Abingdon (GB)

(73) Assignee: Tokamak Energy Ltd, Abingdon (GB)

( * ) Notice: Subject to any disclaimer, the term of this patent is extended or adjusted under 35 U.S.C. 154(b) by 361 days.

(21) Appl. No.: 18/256,345

(22) PCT Filed: Dec. 1, 2021

(86) PCT No.: PCT/EP2021/083751
§ 371 (c)(1),
(2) Date: Jun. 7, 2023

(87) PCT Pub. No.: WO2022/122501
PCT Pub. Date: Jun. 16, 2022

(65) Prior Publication Data
US 2024/0087760 A1      Mar. 14, 2024

(30) Foreign Application Priority Data

Dec. 8, 2020    (GB) ...................................... 2019269

(51) Int. Cl.
G21B 1/25        (2006.01)
G21B 1/13        (2006.01)
(Continued)

(52) U.S. Cl.
CPC ................. G21B 1/25 (2013.01); G21B 1/13 (2013.01); B22F 10/25 (2021.01); C23C 16/04 (2013.01); C23C 24/085 (2013.01); G21B 1/057 (2013.01)

(58) Field of Classification Search
CPC .. G21B 1/25; G21B 1/13; G21B 1/057; B22F 10/25; C23C 16/04; C23C 24/085
(Continued)

(56) References Cited

U.S. PATENT DOCUMENTS 4,145,250 A        3/1979   Ohkawa et al.
2019/0141827 A1*   5/2019   Gonzalez ................. G21B 1/13

FOREIGN PATENT DOCUMENTS

CN          102653856 A      9/2012
JP          S5662964 A       5/1981
(Continued)

OTHER PUBLICATIONS

Japanese Patent Office Notice of Reasons for Refusal for Application No. 2023534346 dated Aug. 6, 2025 (15 pages including English machine translation).
(Continued)

*Primary Examiner* — Jack W Keith
*Assistant Examiner* — Daniel Wasil
(74) *Attorney, Agent, or Firm* — Michael Best & Friedrich LLP

(57)        ABSTRACT

A method of repairing a divertor or first wall surface in a tokamak plasma vessel. The divertor or first wall surface comprises a refractory metal having a melting point of at least 2000° C. A pressure of less than 25 mbar is maintained within the plasma vessel following the end of operation of the plasma vessel. The refractory metal is deposited onto the divertor or first wall surface within the plasma vessel via a deposition process which is one of: additive manufacturing; physical vapour deposition; thermal spray; arc ion plating; diode laser cladding; and chemical vapour deposition.

19 Claims, 5 Drawing Sheets

(51) Int. Cl.
| | |
|---|---|
| *B22F 10/25* | (2021.01) |
| *C23C 16/04* | (2006.01) |
| *C23C 24/08* | (2006.01) |
| *G21B 1/05* | (2006.01) |

(58) Field of Classification Search
USPC .................................................. 376/134, 150
See application file for complete search history.

(56) References Cited

FOREIGN PATENT DOCUMENTS

| | | |
|---|---|---|
| JP | H02049191 A | 2/1990 |
| JP | H04353794 A | 12/1992 |
| JP | H08338889 A | 12/1996 |

OTHER PUBLICATIONS

International Search Report and Written Opinion for Application No. PCT/EP2021/083751 dated Apr. 13, 2022 (22 pages).

International Preliminary Report on Patentability for Application No. PCT/EP2021/083751 dated Feb. 1, 2023 (6 pages).

United Kingdom Intellectual Property Office Search Report for Application No. GB2019269.6 dated Jun. 8, 2021 (4 pages).

United Kingdom Intellectual Property Office Examination Report for Application No. GB2019269.6 dated Aug. 20, 2021 (4 pages).

Marinelli et al., "Development of Wire + Arc additive manufacture for the production of large-scale unalloyed tungsten components", International Journal of Refractory Metals and Hard Materials, vol. 82, May 2019, pp. 329-335.

Hancock et al., "Exploring complex high heat flux geometries for fusion applications enabled by additive manufacturing", Fusion and Engineering Design, 2018, 7 pages.

Bhatt et al., "Different Types of Lithium Coating in Tokamak ADITYA", IEEE Transactions on Plasma Science, 2012, vol. 40, No. 6, pp. 1773-1777.

Castro et al., "The effect of substrate temperature on the thermal diffusivity and bonding characteristics of plasma sprayed beryllium", Fusion Engineering and Design, 1997, vol. 37, pp. 243-252.

Chinese Patent Office Action for Application No. 202180082469.2 dated Nov. 22, 2025 (19 pages inlcuding English machine translation).

Liu et al., "Research progresses on preparation technologies of tungsten coating", Materials Science and Engineering of Powder Metallurgy, vol. 16 No.3, Jun. 2011 (25 pages including English machine translation).

Japanese Patent Office Action for Application No. 2023534346 dated Dec. 9, 2025 (11 pages including English machine translation).

Kenjiro Obara et al., "Prototype of in-situ coating equipment for JT-60 Development tests", Japan Energy research institute, JAERI-M Report, 1987 (73 pages including English Statement of Relevance).

* cited by examiner

REPAIRING A SURFACE OF A DIVERTOR OR FIRST WALL IN A TOKAMAK VIA DEPOSIT OF REFRACTORY METAL WHILE MAINTAINING A VACUUM

CROSS-REFERENCE TO RELATED APPLICATION(S)

This application is a national phase entry of PCT/EP2021/083751, filed on Dec. 1, 2021 which claims priority to GB 2019269.6, filed on Dec. 8, 2020, the entire contents of each of which are incorporated herein by reference.

FIELD OF THE INVENTION

The present invention relates to tokamak plasma vessels. In particular the invention relates to methods and apparatus for depositing refractory metals onto the divertor and first wall of the tokamak.

BACKGROUND

A divertor is a device within a tokamak plasma vessel which allows for the removal of waste material and power from the plasma whilst the tokamak is operating. The waste material naturally arises as particles diffuse out from the magnetically confined plasma core. The waste particles are a combination of the fuel (Deuterium and Tritium), fusion products (helium ash), electrons, and heavier ions released from the walls. To confine the plasma, tokamaks utilise magnetic fields. However, particles slowly and randomly diffuse out, and eventually impact one of the divertor surfaces, which are configured to withstand the high flux of ions.

A poloidal cross section through one side of an exemplary tokamak is illustrated in FIG. 1. The tokamak 100 comprises a toroidal plasma vessel 101. Poloidal magnetic field coils produce a poloidal magnetic field to confine the plasma (which is carrying a current). If there were no collisions between plasma particles, turbulence, waves or other such phenomena, then the plasma (made from charged particles) would effectively be tied to magnetic field lines (which can be represented as lines of constant poloidal flux 113). The plasma is said to be confined onto lines of constant poloidal flux inside the "plasma core" because the lines of constant flux are closed, so called "closed flux surfaces". Through collisions and other such processes, the plasma slowly diffuses out of the plasma core. The "last closed flux surface" 111 has a null point 112 at one end (usually the lower end) and defines the edge of the confined core. Flux lines 114 immediately outside the plasma core (the "scrape off layer") intersect two surfaces below the null: the outboard (i.e. radially outer) divertor surface 121 (located in this example at the bottom of a channel in the lower part of the plasma vessel), and the inboard (i.e. radially inner) divertor surface 122. Waste particles and power are deposited onto these surfaces, with the majority of the waste particles and power landing on the outboard divertor surface (the exact split between inboard and outboard depends on turbulent physics within the scrape off layer).

A cross section through a second exemplary tokamak is illustrated in FIG. 2. This tokamak has a "double null" divertor. The principle of the "double null" divertor is the same as for the "single null" divertor in FIG. 1, except that nulls and corresponding divertor surfaces 221, 222, 223, 224 are provided at both the upper and lower edges of the plasma core 210. An advantage of the double null configuration is that the heat flux on each divertor surface is roughly half that which would be experienced by a single null configuration.

FIG. 3 shows a more complete illustration of a tokamak in a double-null divertor configuration. The figure is symmetrical both left-right and top-bottom, and for clarity reference numerals have not been duplicated for symmetrical components. FIG. 3 is a cross section taken on a vertical plane across the centre of the tokamak, showing the plasma chamber wall 300 and components within it. The tokamak comprises a plurality of poloidal field coils 301 and toroidal field coils (not shown) to control the plasma. Each divertor assembly 310 comprises a divertor surface 311, located where the plasma will strike the divertor, and a baffle 312. The baffle 312 has a role in plasma shaping and also in protecting components located behind the baffle.

The divertor surfaces experience high heat loads and significant erosion. Therefore, they either must be made from materials which can tolerate high heat, and which are resistant to such erosion, or from a metal with a low atomic number such as beryllium or lithium, so that any erosion does not contaminate the plasma. It is also preferable for the divertor surfaces to be made from a metal, to reduce the possibility of tritium retention within the divertors. As such, suitable materials for the divertor surfaces include the refractory metals, lithium, and beryllium.

The refractory metals are the metallic elements having a melting point above 2,000° C., including niobium, molybdenum, tantalum, tungsten, and rhenium. They are also very resistant to wear, including by plasma erosion. However, even when using these metals as the divertor surface, wear will still occur and the divertors will need to be replaced or repaired regularly. Replacement or repair of the divertors requires shutting down the reactor, and re-pressurising the plasma vessel—which requires significant downtime, as the chamber must be returned to vacuum before operation of the plasma vessel can resume, which involves a long de-gassing process to remove any residual gasses adsorbed into the chamber walls.

Similar considerations apply to the "first wall" of the plasma vessel, i.e. the parts of the inner wall of the chamber that directly face the plasma, including e.g. covers on coils within the plasma chamber. This will also suffer from heat and wear caused by interaction with the plasma, and will periodically need to be repaired to mitigate damage from those instabilities.

SUMMARY

According to a first aspect of the invention, there is provided a method of repairing a divertor or first wall surface in a tokamak plasma vessel. The divertor or first wall surface comprises a refractory metal having a melting point of at least 2000° C. A pressure of less than 25 mbar is maintained within the plasma vessel following the end of operation of the plasma vessel. The refractory metal is deposited onto the divertor or first wall surface within the plasma vessel via a deposition process which is one of:

additive manufacturing;

physical vapour deposition;

thermal spray;

arc ion plating;

diode laser cladding; and chemical vapour deposition.

According to a second aspect of the invention, there is provided a method of operating a tokamak plasma vessel. A first plasma is formed and maintained within the plasma vessel. The first plasma is extinguished. A divertor or first wall of the plasma vessel is repaired by a method according to the first aspect. A second plasma is formed within the plasma vessel. The pressure within the plasma vessel remains below 25 mbar between the extinguishing of the first plasma and the forming of the second plasma.

According to a further aspects, there is provided a tokamak plasma vessel. The tokamak plasma vessel comprises a vacuum chamber, a vacuum maintenance system, a first wall, a divertor, and a refractory metal deposition system. The vacuum maintenance system is configured to maintain a pressure of less than 25 mbar within the vacuum chamber. The first wall and divertor each have a surface comprising a refractory metal having a melting point above 2000° C. The refractory metal deposition system differs between the further aspects.

In the third aspect, the refractory metal deposition system comprises a refractory metal source, a heating system, a positioning system, and a controller. The heating system is configured to heat a portion of the refractory metal of the refractory metal source. The positioning system is config- ured to position the heat source and refractory metal of the refractory metal source to any region of the first wall or divertor surface. The controller is configured to cause the heating system to heat a portion of the refractory metal from the refractory metal source and cause the positioning system and/or the refractory metal source to deposit the portion of the refractory metal against the target area to melt the portion of the refractory metal onto the target area;

In the fourth aspect, the refractory metal deposition sys- tem comprises a refractory metal source, a positioning system, and a controller. The refractory metal source com- prises refractory metal and a vaporisation system configured to vaporise the refractory metal, and an outlet. The posi- tioning system is configured to position the outlet of the refractory metal source such that vaporised refractory metal is directed to any region of the first wall or divertor surface. The controller is configured to:

cause the position system to position the outlet such that when vaporised, refractory metal will be directed to a target area of the first wall or divertor surface;
   cause the refractory metal source to vaporise a portion of the refractory metal, thereby coating the target area in the refractory metal.

In the fifth aspect, the refractory metal deposition system comprises a refractory metal source, a heater, a spray unit, and controller. The controller is configured to:

cause the refractory metal source to supply refractory metal to the heater;
   cause the spray unit to spray heated particles of the refractory metal from the heater to the divertor and/or first wall surface In the sixth aspect, the refractory metal deposition system comprises a refractory metal source, an electrode, and a voltage source. The electrode is configured to strike an arc between the electrode and the refectory metal source. The voltage source is configured to provide a voltage to the divertor and/or first wall such that the divertor and/or first wall gains a charge opposite to the charge of a plasma caused by the arc.

In the seventh aspect, the refractory metal deposition system comprises a refractory metal source, a heating sys- tem, a positioning system, and a controller. The heating system is configured to heat a target area of the first wall or divertor surface. The positioning system is configured to position the heat source and refractory metal of the refrac- tory metal source to any region of the first wall or divertor surface. The controller is configured to:

4 cause the heating system to heat a target area on the divertor or first wall surface such that the surface melts in the target area;
   cause the positioning system and/or the refractory metal source to contact the portion of the refractory metal against the target area to melt the portion of the refractory metal onto the target area.

In the eighth aspect, the refractory metal deposition system comprises a chemical reactant supply system and a heater. The chemical reactant supply system is configured to supply one or more reagents to the chamber in gaseous or plasma form via a port, wherein the reagents react to form the refractory metal and a gaseous by-product. The heater is configured to heat the divertor or first wall surface to a temperature sufficient to cause the reagents to react to form the refractory metal. The vacuum maintenance system is configured to remove the gaseous by-product and any excess reagent from the chamber after deposition of the refractory metal.

Further embodiments are presented in claim 2 et seq.

DETAILED DESCRIPTION

A system and method for reconditioning the divertors or first wall of a tokamak plasma vessel in-situ is proposed below, to allow for the repair without the need to repres- surise the plasma vessel. The proposed solution involves using in-vacuum deposition techniques suitable for use with the refractory metals, and providing these in the plasma vessel in such a way that vacuum is maintained. This reduces the downtime of the plasma vessel during such repair— instead of a long repressurisation, depressurisation, and degassing procedure, the plasma operations can be tempo- rarily suspended while left under vacuum, the repairs com- pleted, and then the chamber can be reused almost imme- diately (with an optional step to remove any by-products of the deposition process).

Figure 1:
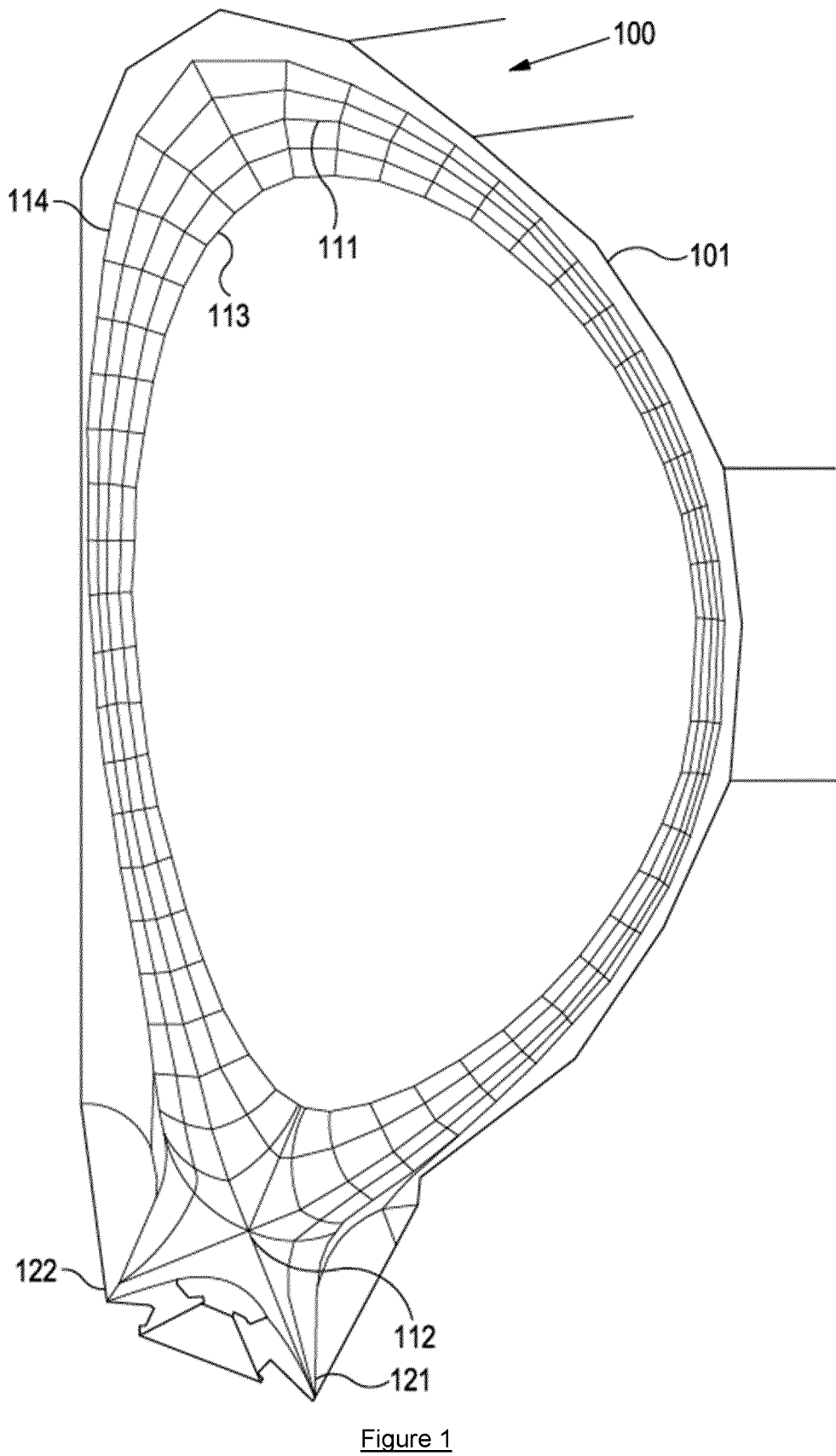
FIG. 1 is a schematic illustration of a tokamak with a single-null divertor setup.
Figure 2:
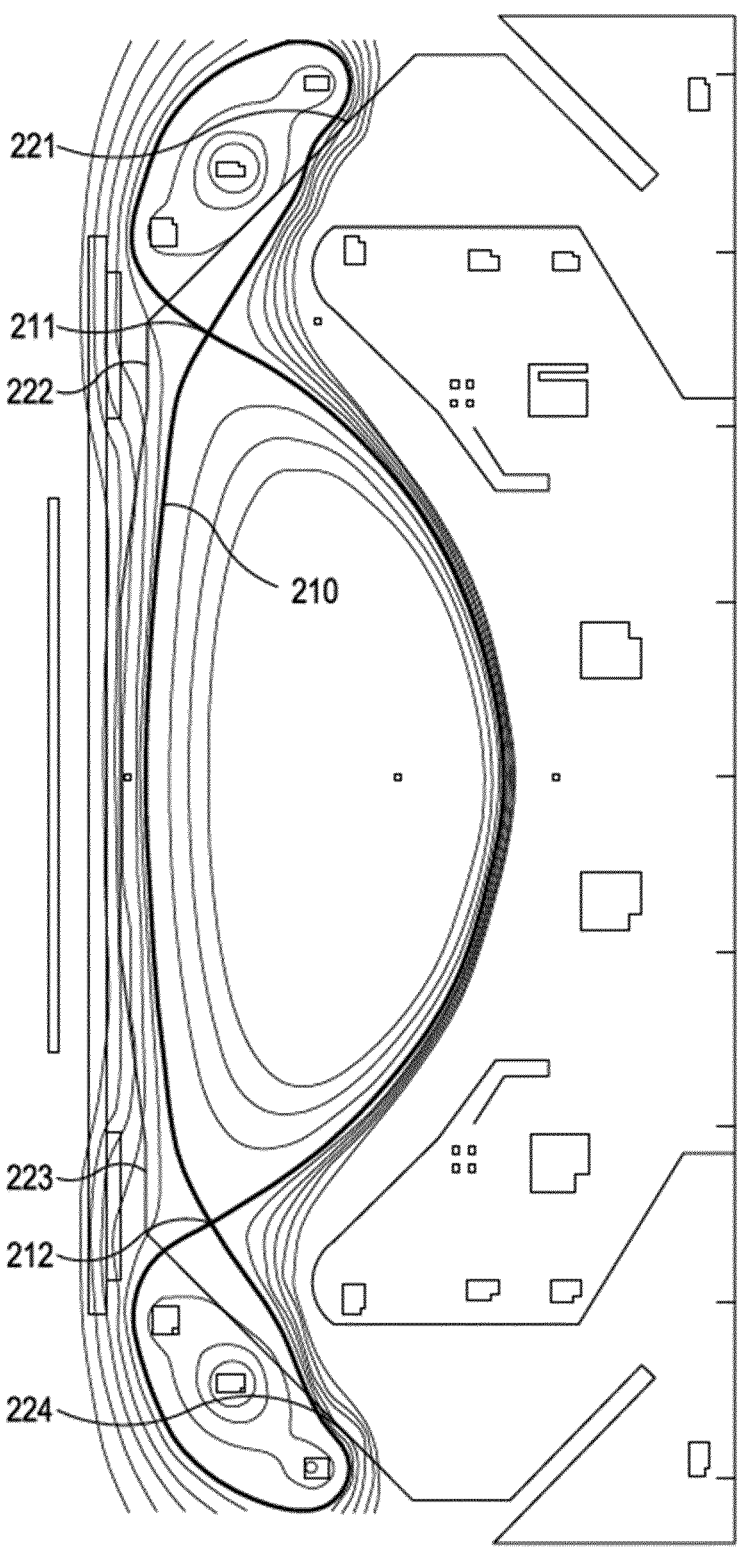
FIG. 2 is a schematic illustration of a tokamak with a double-null divertor setup.
Figure 3:
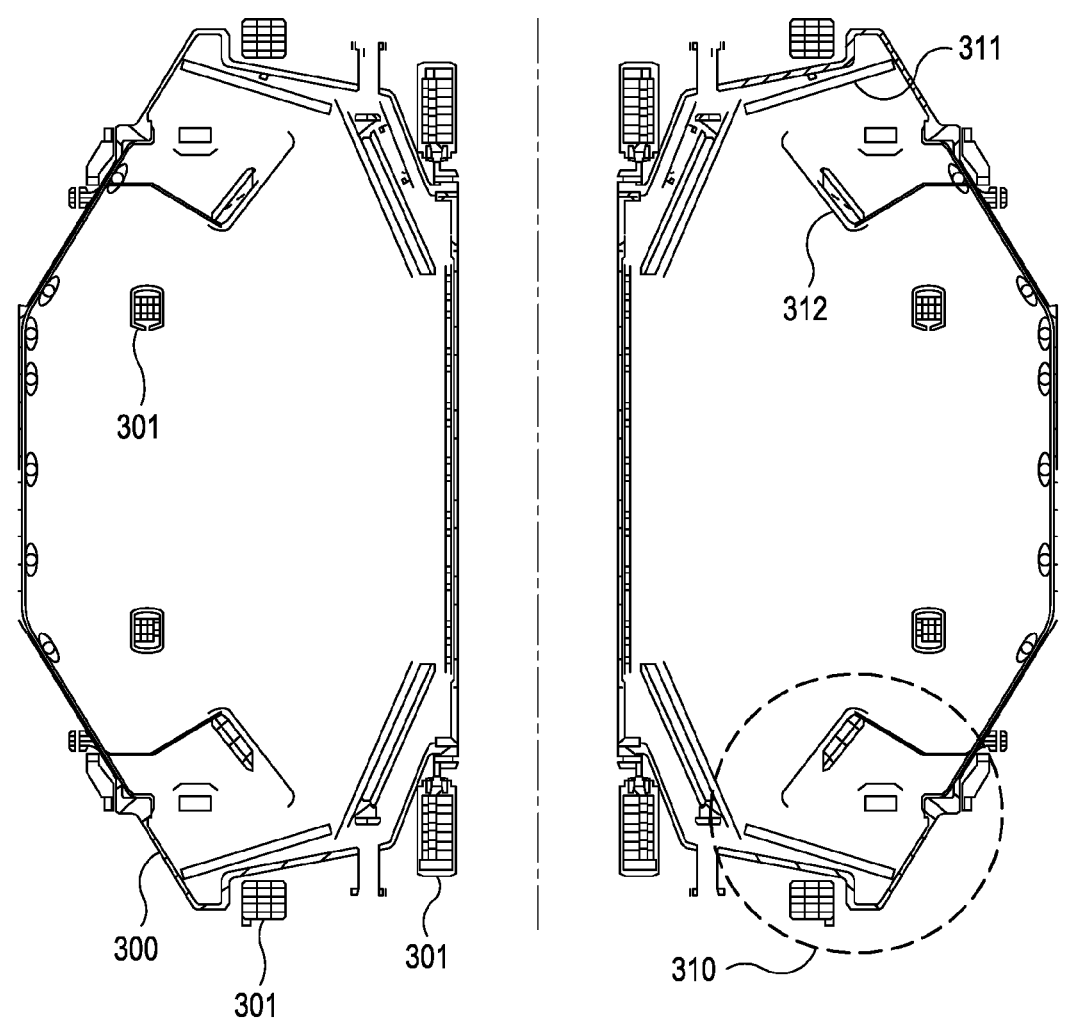
FIG. 3 is a cross section of a tokamak with a double null divertor setup, showing additional components.
Figure 4:
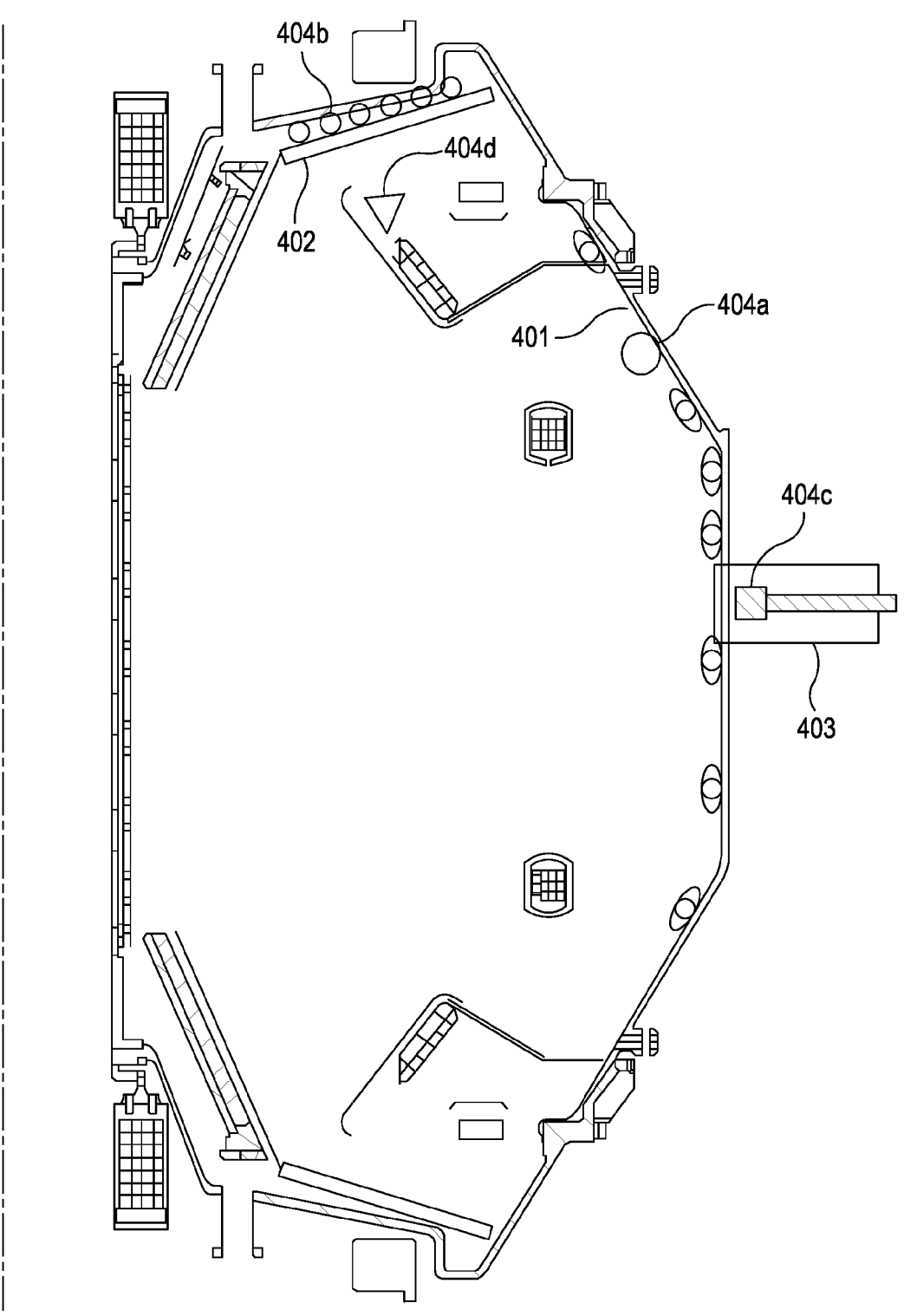
FIG. 4 is a schematic illustration of an exemplary toka- mak.

FIG. 4 shows a schematic illustration of an exemplary plasma vessel. The plasma vessel 400 comprises a first wall 401, a divertor surface 402, a port 403, and a refractory metal deposition system 404a,b,c,d. During operation of the plasma vessel, wear will occur to the divertor and the first wall. To repair this wear, the plasma vessel is shut down, but kept at vacuum, and the refractory metal deposition system 404a,b,c,d is used to deposit a refractory metal onto the divertor 402 and/or the first wall 301. Depending on the deposition technique used, the refractory metal deposition system may include components which are always within the reactor chamber (e.g. electrodes 404a), components built into the divertor and/or first wall (e.g. heaters 404b), components which are present on an arm which can be inserted via a port (e.g. refractory metal source 404c), and/or components which are located within a protected region of the chamber (e.g. spraying system 404d).

In general, components of the refractory metal deposition system can be included within the reactor chamber if they are in protected regions (i.e. regions of the tokamak into which the plasma cannot extend) or would not protrude so far into the chamber that they would disrupt the plasma, and they can be made resistant enough to heat and wear to survive the conditions within the chamber. Otherwise, components which require access to the chamber itself during deposition may be provided in such a way that they can be introduced via a port, using a "load lock" or similar means to preserve the vacuum of the chamber.

Some example deposition systems, using various deposition techniques, will now be described. However, it should be noted that the any deposition technique may be used, provided it is suitable for applying a refractory metal to a surface composed of that metal, and can be operated in a vacuum. In the standard literature, many deposition techniques include an initial step of providing a vacuum, removing moisture from the component, or similar degassing procedures. The plasma vessel will already be under vacuum and degassed, so these steps will generally not be necessary. Some techniques include steps of etching the component to remove surface oxides—usually by ion bombardment. Again, this may not be necessary, as the divertor and first wall have already been effectively etched by the plasma (and indeed, this "etching" is the wear that require repair).

The first example presented is arc ion plating. Arc ion plating is performed under vacuum, on a clean surface. In other applications, this would be cleaned by heating to remove moisture, and then ion etching to remove surface impurities. However, these steps are optional when used in a tokamak, as there will be no surface moisture and the plasma will effectively act as an ion etch. An arc discharge is formed between a refractory metal source and a ground, in order to vaporise the refractory metal into a positively charged plasma. A negative voltage is applied to the target surface (i.e. the divertor or the first wall region needing repair), which will attract the ions of refractory metal, and cause them to deposit onto the surface. Alternatively, the plasma may be negatively charged and the target may be positively charged.

For use in-situ in a tokamak, arc ion plating may be implemented by providing a refractory metal source (e.g. tungsten) either within the chamber or in a port, with electrodes configured to strike an arc to the source to generate the charged plasma, and with apparatus configured to provide a voltage to the divertor and/or the first wall. Where arc ion plating is used to repair the first wall, the voltage may be applied locally only specific regions of the first wall, e.g. to target regions where significant wear has occurred or is expected.

The second example presented is chemical vapour deposition (CVD). Chemical vapour deposition is a coating process that uses thermally induced chemical reactions at the surface of a heated target, with reagents supplied as gasses. For example, tungsten may be deposited via the reaction $WF_6 + 3\ H_2 = W + HF$. The reaction will occur on the heated target (i.e. the divertor, the first wall, or selected first wall section), and the reaction by-products are gasses which can be removed from the chamber by returning it to vacuum.

Chemical vapour deposition may be implemented in a tokamak by providing heating elements within the divertor and/or first wall, to heat the target regions to the temperatures required for CVD (typically between 600° C. and 1100° C.), and the introducing the reagents to the plasma vessel via a port. Once the reaction is completed, any remaining reagent or gaseous byproducts can be pumped out of the plasma vessel.

A variant of CVD is plasma assisted CVD (PACVD), where an electrical discharge is used to accelerate the reaction of the reagents by forming them into a plasma. Coating rates for PACVD are generally lower than for conventional CVD, but in a tokamak this is partly counteracted by the lower pressure of reactants required, which will reduce the pumping needed to restore vacuum.

As a third example, the deposition method used may be thermal spraying. In thermal spraying, a large number of small softened or melted particles of the refractory metal are projected onto the target surface, where they will flatten and adhere to it to provide even coverage. Thermal spraying typically involves a source of material feedstock which is passed through a heat source to achieve the required temperature, and then sprayed onto a divertor. When implemented an a vacuum environment, the heat source is often a plasma.

Thermal spraying may be implemented in a tokamak by providing the apparatus into the tokamak through a port, with no modification to the interior of the plasma vessel required.

As a fourth example, additive manufacture techniques may be used. In applying such techniques to refractory metals, a heat source (e.g. a laser or an electron beam) is used to heat a spot to which the metal will be applied, and then the refractory metal is applied e.g. via blowing powdered refractory metal onto the spot or contacting the end of a refractory metal wire to the spot. Further heat is applied to the applied refractory metal to melt it onto the target spot as a small weld. This is repeated over the area to be covered, and to the required depth. Optionally, the step of heating the target spot may be omitted, and only the refractory metal to be applied is heated.

The resolution of additive manufacturing techniques for refractory metals can be poor—i.e. the minimum spot size for applying the refractory metal may be too large to permit accurately filling a defect or producing an acceptable surface finish. As such, the additive manufacturing may be continued slightly beyond the required thickness and area, and the excess milled off or otherwise removed.

Within a tokamak, additive manufacturing may be implemented by providing a robot having the heat source and refractory metal source (and optionally the milling or other refractory metal removal device), which can then enter through a port and be moved to the site needing repair. Additive manufacturing can be performed at any level of vacuum.

A fifth example is physical vapour deposition (PVD). In PVD, the refractory metal to be deposited is first suspended in gas phase, and then deposited or condensed onto a surface. The metal is vaporised into gas phase within an "evaporation cell", e.g. by sputtering, evaporating with a heater such as a resistance heater, electron beam heating, vacuum arc heating, or other suitable technique. The vapour is allowed to fly out of an opening in the evaporation cell, and the opening is shaped and positioned to direct the vapour onto the target surface. This is a "line of sight" deposition process, so anything within the cone of vapour will have the refractory metal deposited on it, and there will be shadowing if there are any steps or ridges on the target.

Within a tokamak, the evaporation cell may enter through a port on an arm, to be directed to the target area. Alternatively, the evaporation cell may be stationary and an outlet hose on an arm used to direct the flow of vapour to the target area. PVD may be performed under hard vacuum, e.g. around $10^{-6}$ mbar or less.

Many of the above deposition techniques may be applied to specific regions of the tokamak. As such, there is an advantage to identifying the regions in need of repair and reconditioning. Initial detection of the need for reconditioning may be done by monitoring the plasma (e.g. to identify strikes against the first wall), monitoring the temperature of the first wall elements (e.g. to identify regions which are likely to have partially melted or sublimated), or other similar monitoring. During the reconditioning process, prior to application of the refractory metal by one of the above techniques, a more detailed scanning method may be used to determine the extent of the damage to the first wall and/or the repair needed. This may include optical scanning, a camera e.g. a depth-mapping camera, LIDAR imaging, or other depth sensing to map the damaged surface, which may produce a $3d$ model of the surface or a $2d$ image from which the damage can be determined. The results of this scanning can then be used by the controller of the deposition process to control the deposition such that the repair is focused on the areas that need it and limit the additional deposition of material outside of those areas. Apparatus for such scanning may be inserted into the tokamak via a robot arm or similar positioning means, which may be the same as the positioning means used to position the apparatuses implementing the deposition techniques above.

Several of the above techniques result in powder, milling debris, or similar within the tokamak following repair. The deposition apparatus may include a debris removal system which collects the powder or debris left by the deposition process and/or any subsequent milling. This may be implemented by means of a vacuum pump, as the debris will flow into the pump due to the movement of residual gas in the chamber as the pump is operated (or any gas added during the deposition). The primary vacuum pump(s) for a tokamak will not generally be resilient enough to tolerate a significant amount of powder or milling debris, so a secondary vacuum pump (or pumps) may be provided which is of a type that can tolerate debris entering the pump, e.g. a scroll pump. A small amount of gas may be added to the chamber, maintaining the pressure below the desired threshold, to assist with this.

Where the above techniques require introducing powder to the chamber, this may be done by flowing the powder into the chamber in a flow of an inert gas such as argon. While this will result in a partial loss of vacuum, it will still allow maintenance of pressures significantly below atmospheric pressure. As noted above, pumping out the inert gas will have the additional effect of helping to remove any powder or other debris in the chamber.

Masking may be used to provide additional precision to the techniques above. This may be done by an application of a removable mask around the target area, which is removed following deposition, or by providing a mask as part of the deposition apparatus which restricts the area onto which the refractory metal is deposited.

In general, masking and/or milling to restrict the area or improve the surface smoothness is not essential. The above deposition techniques result in the layer thicknesses on the order of microns to millimetres, and this additional thickness does not have a significant impact on the first wall. Milling to improve the surface smoothness provides a slight advantage in that a smoother surface will generally erode less and/or more predictably due to plasma impacts. Masking or milling to prevent deposition outside the area needing repair will provide a slight advantage in that the result will be a more even first wall which will erode and conduct heat more predictably (i.e. without unintended hot spots). However, these effects are small and must be balanced against the additional complexity of masking and milling, and the need to remove debris from milling.

As can be seen from the above examples, there are a range of deposition techniques which can be used to recondition the divertor and/or first wall of a tokamak plasma vessel. Again, it should be noted that there are more techniques than those presented in the above examples, and that any deposition technique which can be accomplished in vacuum using a refractory metal can provide the general advantages obtained by depositing metal onto the divertor and/or first wall in situ. In addition to the general advantages of not needing to repressurise the chamber and re-establish vacuum from atmospheric pressure, individual techniques will have advantages over other techniques.

For example, of the techniques discussed above, arc ion plating and CVD do not require line of sight between the material source and the target (i.e. the divertor or first wall). Arc ion plating and thermal spraying leave only minimal material in the chamber which would need to be pumped out before resuming operation (in comparison to the reaction by-products left by CVD and other techniques). Thermal spraying requires no particular modifications to the divertor or first wall itself—i.e. there is no requirement to heat the target area or provide an electrical charge, allowing it to be easily integrated independently of other design considerations of the plasma vessel.

Where heating of the target (i.e. the divertor or first wall) is required during deposition, this may be provided by resistive heating elements integrated within or behind the target, or by passing current directly through the target. Alternatively, this may be achieved by pumping hot gas through coolant channels of the divertor or first wall, to achieve the required temperature. For deposition methods where heating would be required prior to deposition in order to remove moisture, this will generally not be necessary.

Where the target requires an electrical charge, electrical components may be integrated into the target to provide such a charge.

An etching system, e.g. an ion etching system, may be used to clean the target prior to deposition. This is optional, as even in deposition methods which would normally require such etching, the target is likely to be clean due to the action of the plasma on the target. Additionally, the target may be heated prior to degas any hydrogen which has absorbed into the divertor plate or first wall.

Where the term "vacuum" is used above, it will be appreciated that a perfect vacuum is not achievable in practice. In some scenarios, the interior pressure of the plasma vessel may be kept at or around the pressure of the plasma vessel obtained once the plasma has cooled, e.g. within an order of magnitude of the pressure obtained on the plasma has cooled, or for example between 2 and $7 \times 10^{-8}$ mbar. As another example, the interior pressure of the plasma vessel may be maintained at a medium vacuum, i.e. less than 25 mbar. As a yet further example, the interior pressure of the plasma vessel may be maintained at a high vacuum, i.e. such that the mean free path of a particle in the plasma vessel is less than the radius of the plasma vessel. While these represent very different grades of vacuum, it will be appreciated that even maintaining the vessel at or below a medium vacuum is a considerable improvement over current methods that require returning the vessel to atmospheric pressure in order to remove divertor or first wall sections.

While the above refers to a tokamak plasma vessel, it will be noted that this is of particular use in a tokamak fusion reactor, where the wear on the divertors and the first wall will be significant compared to cooler plasmas, and there is potentially a greater need to avoid downtime (for efficient running of experiments, and eventually for enabling economic power generation).

Apparatus implementing the above described methods may be controlled by a controller, which may be implemented as software running on one or more processors. The controller may be integrated with the hardware of the plasma vessel or may be implemented as software running on a remote computer having access to functions of the plasma vessel and deposition apparatus. The controller may be implemented as distributed software running on a plurality of computers.

Figure 5:
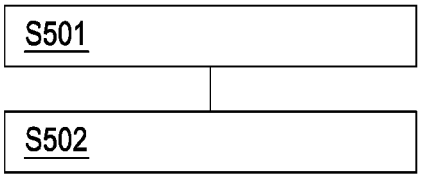
FIG. 5 is a flowchart for a method of repairing a divertor or first wall surface.

FIG. 5 is a flowchart for a method of repairing a divertor or first wall surface in a tokamak plasma vessel, wherein the divertor or first wall surface comprises a refractory metal having a melting point of at least 2000° C. In step S501, a pressure of less than 25 mbar is maintained within the plasma vessel following the end of operation of the plasma vessel. In step S502, the refractory metal is deposited onto the divertor or first wall surface within the plasma vessel via a deposition process which is one of:

additive manufacturing;
physical vapour deposition;
thermal spray;
arc ion plating;
diode laser cladding; and
chemical vapour deposition.

Figure 6:
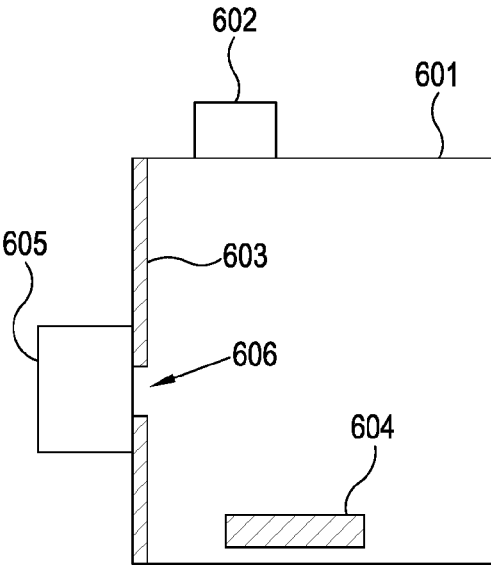
FIG. 6 is a schematic diagram of a tokamak plasma vessel.

FIG. 6 is a schematic diagram of a tokamak plasma vessel. The tokamak plasma vessel comprises:

a vacuum chamber 601;
a vacuum maintenance system 602 configured to maintain a pressure of less than 25 mbar within the vacuum chamber;
a first wall 603 and a divertor 604, each having a surface comprising a refractory metal having a melting point above 2000° C., and;
a refractory metal deposition system 605, e.g. as described in the above examples. In this example the refractory metal deposition system is located at a port 606, such that components of the refractory metal deposition system can enter the vacuum chamber via the port.

Figure 7:
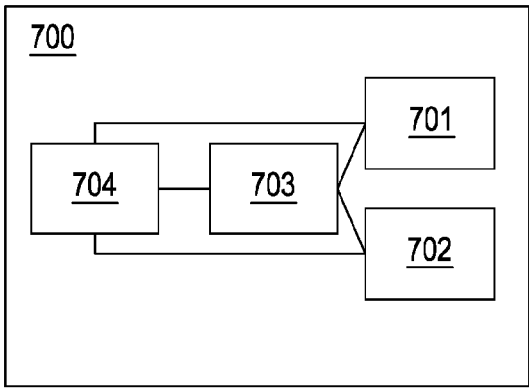
FIG. 7 is a schematic diagram of an exemplary refractory metal deposition system.

FIG. 7 is a schematic diagram of an exemplary refractory metal deposition system, configured for the additive manufacturing example above. The refractory metal deposition system 700 comprises:

a refractory metal source 701;
a heating system 702 configured to heat a portion of the refractory metal of the refractory metal source, which may be for example an electron gun or a laser;
a positioning system 703 configured to position the heat source and refractory metal of the refractory metal source to any region of the first wall or divertor surface, which may be for example a robot arm;
a controller 704 configured to cause the heating system to heat a portion of the refractory metal from the refractory metal source and cause the positioning system and/or the refractory metal source to deposit the portion of the refractory metal against a target area on the divertor or first wall surface to melt the portion of the refractory metal onto the target area

The invention claimed is:

1. A method of repairing a divertor or first wall surface in a tokamak, the tokamak comprising:

a vacuum chamber;

a vacuum maintenance system configured to maintain a pressure of less than 25 mbar within the vacuum chamber;

a first wall and a divertor within the vacuum chamber, each having a surface comprising a refractory metal having a melting point above 2000° C.; and a refractory metal deposition system comprising:

a refractory metal source;

a heating system; and a positioning system, the method comprising:

the vacuum maintenance system maintaining a pressure of less than 25 mbar within the vacuum chamber during suspension of operation of the tokamak;

during the suspension of operation of the tokamak, depositing the refractory metal of the refractory metal source onto the divertor or first wall surface via a deposition process comprising:

operating the positioning system to position at a target area of the first wall surface or the divertor surface each of:

a portion of the refractory metal of the refractory metal source; and the heating system; and operating the heating system to melt the portion of the refractory metal;

thereby depositing the portion of the refractory metal against the target area.

2. A method according to claim 1, and comprising, prior to depositing the portion of the refractory metal against the target area, heating the target area.

3. A method according to claim 1, and comprising performing the step of depositing the refractory metal for each of a plurality of target areas within a region of the first wall surface, thereby coating the region of the first wall surface in the refractory metal.

4. A method according to claim 1, wherein the refractory metal is provided as a powder, and the refractory metal source comprises a powder dispenser configured to dispense the refractory metal powder to the target area.

5. A method according to claim 4, wherein the powder dispenser comprises an inert gas source and a refractory metal powder source, and the powder dispenser dispenses the refractory metal powder by blowing the refractory metal powder from the refractory metal powder source to the target area via an output channel.

6. A method according to claim 1, wherein the refractory metal source comprises a refractory metal wire, and wherein the portion of the refractory metal source is one end of the refractory metal wire.

7. A method according to claim 1, wherein the heating system comprises a laser or an electron beam.

8. A method according to claim 1, and comprising, prior to depositing the refractory metal, scanning, by a scanning system, the divertor or first wall surface in order to identify regions in need of repair, and wherein the step of depositing the refractory metal comprises depositing the refractory metal onto the regions needing repair.

9. A method according to claim 1, and comprising providing a mask over a portion of the divertor or first wall surface prior to depositing the refractory metal, and removing the mask following deposition of the refractory metal.

10. A method according to claim 1, and comprising milling a portion of the divertor or first wall surface onto which the refractory metal was deposited following deposition.

11. A method according to claim 1, wherein the tokamak comprises first and second vacuum pump systems, wherein the first vacuum pump system is used during operation of the tokamak, and the second vacuum pump system is used during deposition of the refractory metal, and following deposition of the refractory metal in order to remove waste products from the deposition and/or subsequent milling.

12. A method according to claim 11, wherein the secondary vacuum pump system comprises a scroll pump.

13. A method of operating a tokamak, the method comprising:

forming and maintaining a first plasma within the tokamak;

extinguishing the first plasma;

repairing a divertor or first wall of the tokamak by a method according to claim 1;

forming a second plasma within the tokamak;

wherein the pressure within the tokamak remains below 25 mbar between the extinguishing of the first plasma and the forming of the second plasma.

14. A tokamak comprising:

a vacuum chamber;

a vacuum maintenance system configured to maintain a pressure of less than 25 mbar within the vacuum chamber during suspension of operation of the tokamak;

a first wall and a divertor within the vacuum chamber, each having a surface comprising a refractory metal having a melting point above 2000° C.; and a refractory metal deposition system comprising:

a refractory metal source;

a heating system configured to heat a portion of the refractory metal of the refractory metal source;

a positioning system configured to position the heating system and the portion of the refractory metal of the refractory metal source to any region of the first wall surface or the divertor surface;

a controller configured to function during the suspension to:

operate the positioning system to position at a target area of the first wall surface or the divertor surface each of:

a portion of the refractory metal of the refractory metal source; and the heating system; and operate the heating system to melt the portion of the refractory metal;

thereby depositing the portion of the refractory metal against the target area during the suspension.

15. Apparatus according to claim 14, wherein the heating system is further configured to heat the target area of the first wall or divertor surface.

16. Apparatus according to claim 14, wherein the controller is further configured to perform the steps of operating the positioning system and operating the heating system for each of a plurality of target areas within a region of the first wall surface, thereby coating the region of the first wall surface in the refractory metal.

17. A tokamak according to claim 14, wherein the vacuum chamber comprises a port, and wherein at least a portion of the refractory metal deposition system is configured to enter the vacuum chamber via the port.

18. A tokamak according to claim 14, wherein the vacuum maintenance system comprises first and second vacuum pump systems, wherein the controller is configured to use the first vacuum pump system to maintain the vacuum during operation of the tokamak, and to use the second vacuum pump system to maintain the vacuum during deposition of the refractory metal and removal of waste products from the deposition and/or subsequent milling.

19. A tokamak according to claim 18, wherein the second vacuum pump system comprises a scroll pump.

* * * * *